(12) United States Patent
Masui et al.

(10) Patent No.: US 8,648,652 B2
(45) Date of Patent: Feb. 11, 2014

(54) BAND PASS FILTER AND CALIBRATION METHOD FOR BAND PASS FILTER

(75) Inventors: Shoichi Masui, Sendai (JP); Jingbo Shi, Sendai (JP)

(73) Assignee: Fujitsu Microelectronics Solutions Limited, Yokohama (JP)

( * ) Notice: Subject to any disclaimer, the term of this patent is extended or adjusted under 35 U.S.C. 154(b) by 77 days.

(21) Appl. No.: 13/191,304

(22) Filed: Jul. 26, 2011

(65) Prior Publication Data

US 2012/0212288 A1 Aug. 23, 2012

(30) Foreign Application Priority Data

Feb. 18, 2011 (JP) .................................. 2011-33790

(51) Int. Cl.
*H03K 5/00* (2006.01)
(52) U.S. Cl.
USPC ............................ 327/557; 327/552; 327/559
(58) Field of Classification Search
USPC ................................................. 327/551–559
See application file for complete search history.

(56) References Cited

U.S. PATENT DOCUMENTS

| | | | | |
|---|---|---|---|---|
| 5,101,220 | A * | 3/1992 | Sullivan | 346/17 |
| 6,680,645 | B2 * | 1/2004 | Greitschus et al. | 327/553 |
| 7,880,536 | B2 * | 2/2011 | Le et al. | 327/558 |
| 2008/0297240 | A1 | 12/2008 | Kondo et al. | |
| 2009/0290728 | A1 * | 11/2009 | Berg | 381/121 |

FOREIGN PATENT DOCUMENTS

JP 2008-301182 A 12/2008

OTHER PUBLICATIONS

Williams & Fred Taylor, "Electronic Filter Design Handbook $4^{th}$ Edition", McGraw-Hill, Chapter 5, pp. 198-237.
S. Amico, et al. "A $4^{th}$-Order Active-Gm-RC Reconfigurable (UMTS/WLAN) Filter", IEEE Journal of Solid-State Circuits, vol. 41, No. 7, Jul. 2006, pp. 1630-1637.
H. Kondo, et al. "Design of Complex BPF with Automatic Digital Tuning Circuit for Low-IF Receivers", IEICE Trans. Electron., vol. E92-C, No. 10, Oct. 2009, pp. 1304-1310.
Tien-Yo Lo, et al. "A 1-V 60MHz Bandpass Filter with Quality-Factor Calibration in 65nm CMOS", IEEE Asian Solid-State Circuits Conference, MediaTek Inc., Taiwan, Nov. 16-18, 2009, pp. 53-56.

* cited by examiner

*Primary Examiner* — Dinh T. Le
(74) *Attorney, Agent, or Firm* — Arent Fox LLP

(57) ABSTRACT

A band pass filter has a high pass filter into which an input signal is input; an amplifier having an inverting input terminal into which an output of the high pass filter is input, wherein the amplifier amplifies an input voltage between the inverting input terminal and a non-inverting input terminal and outputs an output signal to an output terminal; a first resistor connected between a non-inverting output terminal and the inverting input terminal of the amplifier; a first capacitor having a first terminal that is connected to the inverting input terminal; and an inverting amplifier that inverts a polarity of an output signal from the non-inverting output terminal of the amplifier and outputs the inverted signal to a second terminal of the capacitor.

10 Claims, 14 Drawing Sheets

FIG.7 2nd Embodiment

FIG.9 3rd Embodiment

FIG.10 4th Embodiment

BAND PASS FILTER AND CALIBRATION METHOD FOR BAND PASS FILTER

CROSS-REFERENCE TO RELATED APPLICATION

This application is based upon and claims the benefit of priority of the prior Japanese Patent Application No. 2011-033790, filed on Feb. 18, 2011, the entire contents of which are incorporated herein by reference.

FIELD

The embodiment relates to a band pass filter and a calibration method for the band pass filter.

BACKGROUND

A band pass filter is provided in a wireless communication apparatus or the like to extract high frequency signals in a desired frequency band from reception signals received by an antenna, for example. Band pass filters constituted by SAW filters are typical of the prior art. However, it is difficult to form a SAW filter in an integrated circuit, and therefore the SAW filter is provided to an integrated circuit apparatus externally as a discrete circuit element. As a result, the SAW filter causes an increase in the cost of the wireless communication apparatus.

Meanwhile, active filters and switched capacitor filters are gaining attention as on-chip filters. For example, "Japanese Patent Application Publication No. 2008-301182" "Williams & Fred Taylor, "Electronic Filter Design Handbook $4^{th}$ Edition", McGraw-Hill, page 207, Chapter 5" "S. Arnim, V. Giannini and A. Baschirotto, "A $4^{th}$ Order Active-Gm-RC Reconfigurable (UMTS/WLAN) Filter", IEEE J. Solid-State Circuit, pp. 1630-1637, 2006" "H. Kondo, M. Sawada, N. Murakami and S. Masui, "Design of Complex BPF with Automatic Digital Tuning Circuit for Low-IF Receivers", IEICE Trans. Electron., pp. 1304-1310, 2009" and "Tien-Yu Lo, Chuan-Cheng Hsiao, Kang-Wei Hsuch, and Hung-Sung Li, "A 1-V 60 MHz Bandpass Filter with Quality-Factor Calibration in 65 nm CMOS", Proc. Of IEEE Asia Solid-State Circuit Conference, pp. 53-56, 2009" and so on, are available.

In theory, a band pass filter can be constructed by combining a low pass filter with a high pass filter.

In "Tien-Yu Lo, Chuan-Cheng Hsiao, Kang-Wei Hsuch, and Hung-Sung Li, "A 1-V 60 MHz Bandpass Filter with Quality Factor Calibration in 65 nm CMOS", Proc. Of IEEE Asia Solid-State Circuit Conference, pp. 53-56, 2009", a second order band pass filter (BPF) is formed from two OTAs (Operational Transconductance Amplifiers), and accordingly, a fifth order band pass filter (BPF) is formed from ten OTAs. However, since the number of OTAs is large, a large power consumption of 23.5 mW is generated.

It is, however, not easy to reduce the power consumption of a high order band pass filter having a sharp characteristic. For example, to raise a Q value of the BPF, a unity gain frequency fu (Hz) of the OTA forming the BPF is better to be set at no less than ten times a center frequency fc of the BPF. However, the power consumption of the OTA typically increases when the unity gain frequency fu is increased. The reason for this is that to enable the OTA to operate at a high frequency, a gm (transconductance) is increased by increasing a drain current of a transistor, for example.

SUMMARY

A band pass filter has a high pass filter into which an input signal is input; an amplifier having an inverting input terminal into which an output of the high pass filter is input, wherein the amplifier amplifies an input voltage between the inverting input terminal and a non-inverting input terminal and outputs an output signal to an output terminal; a first resistor connected between a non-inverting output terminal and the inverting input terminal of the amplifier; a first capacitor having a first terminal that is connected to the inverting input terminal; and an inverting amplifier that inverts a polarity of an output signal from the non-inverting output terminal of the amplifier and outputs the inverted signal to a second terminal of the capacitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
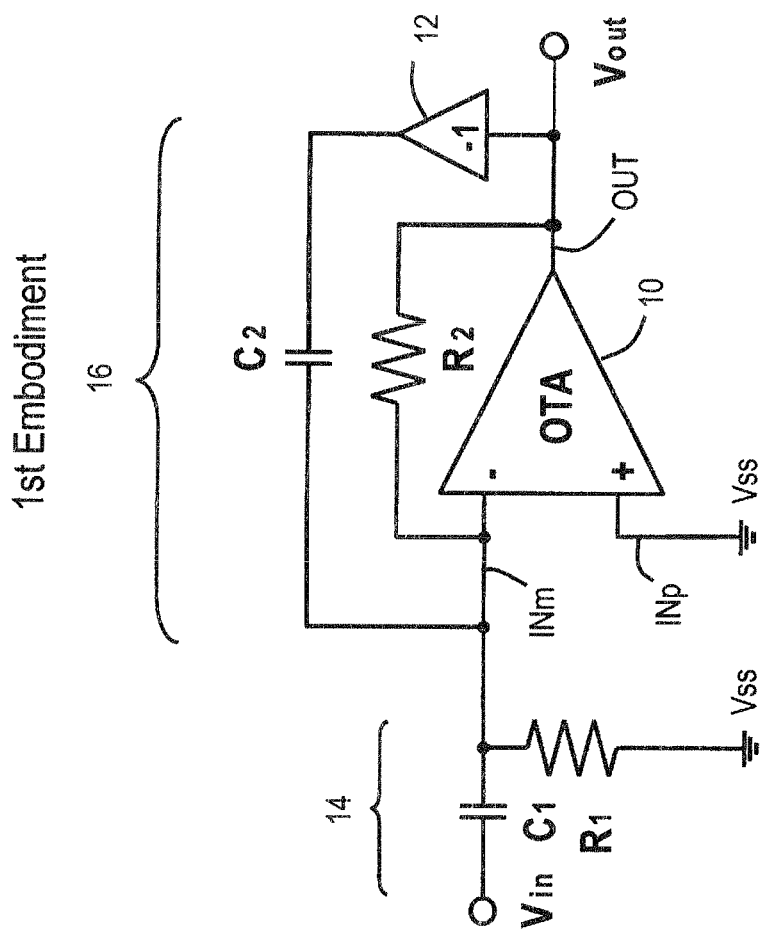
FIG. 1 is a circuit diagram depicting a band pass filter according to a first embodiment.

FIG. 1 is a circuit diagram depicting a band pass filter according to a first embodiment. This band pass filter includes a high pass filter 14 into which an input signal Vin is input, and an amplifier 10 having an inverting input terminal INm into which an output of the high pass filter 14 is input. FIG. 1 depicts a single phase configuration, and therefore a reference voltage (ground) Vss is applied to a non-inverting input terminal INp of the amplifier 10. The amplifier 10 is an operational amplifier such as a Gm RC OTA, for example, which amplifies a voltage of the input signal input into the inverting input terminal INm and outputs an output signal Vout having an amplified voltage to an output terminal OUT (a non-inverting output terminal). The band pass filter further includes a first resistor R2 connected between the non-inverting output terminal OUT and the inverting input terminal INm of the amplifier, a first capacitor C2 having a first terminal connected to the inverting input terminal INm, and an inverting amplifier 12 that inverts a polarity of an output signal from the non-inverting output terminal OUT of the amplifier and outputs the inverted signal to a second terminal of the capacitor.

The high pass filter 14 includes a second capacitor C1 and a second resistor R1 connected between the second capacitor C1 and the reference voltage Vss. Further, the amplifier 10, the first resistor R2, the first capacitor C2, and the inverting amplifier 12 together constitute a low pass filter 16. In other words, the band pass filter depicted in FIG. 1 is constituted by the high pass filter 14 and the low pass filter 16.

The high pass filter 14 passes signals having at least a certain frequency, while the low pass filter 16 passes signals having at most a certain frequency. By combining the these two types of filters, a band pass filter that passes signals in a band centering on a certain frequency can be formed.

Figure 2:
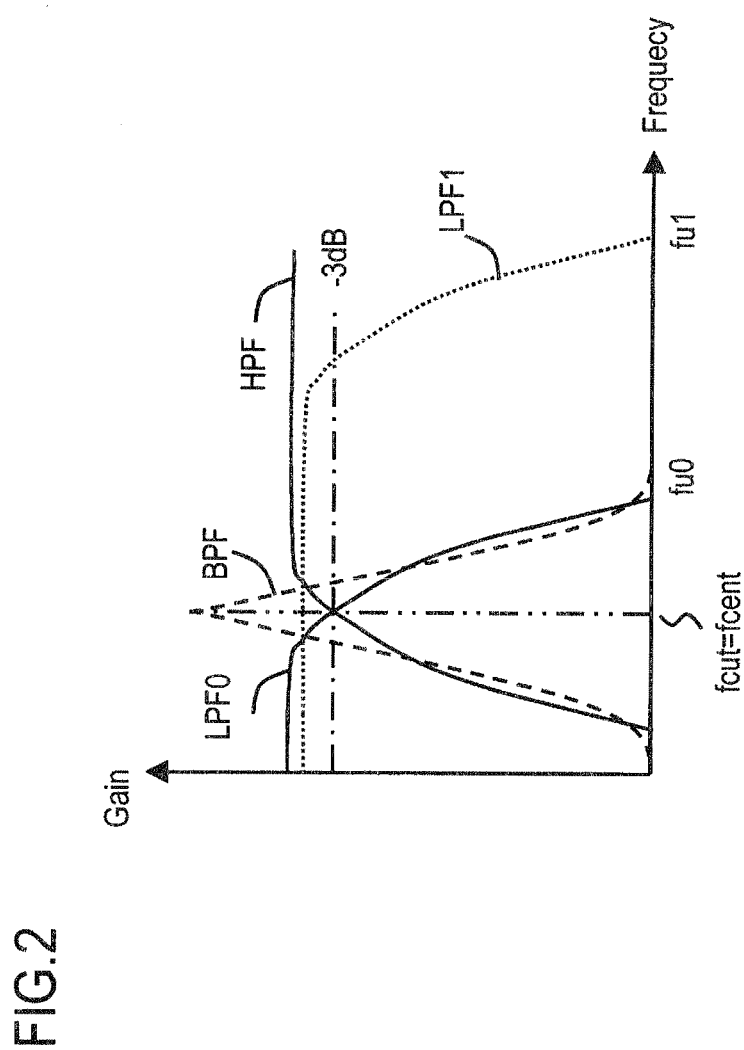
FIG. 2 is a view depicting characteristics of the band pass filter depicted in FIG. 1.

FIG. 2 is a view depicting characteristics of the band pass filter depicted in FIG. 1. FIG. 2 depicts a characteristic LPF0 of the low pass filter 16, a characteristic HPF of the high pass filter 14, and a characteristic BPF of the band pass filter depicted in FIG. 1. The abscissa depicts the frequency, and the ordinate depicts a gain of the filter. A cutoff frequency fcut of the low pass filter 16 is a frequency at which the gain decreases to −3 dB. As depicted by the characteristic HPF, meanwhile, the high pass filter 14 has a large gain in a larger frequency band than the cutoff frequency fcut. Hence, the band pass filter BPF combining the low pass filter LPF0 and the high pass filter HPF passes signals in a narrow band on either side of a center frequency fcent. The center frequency fcent is substantially equal to the cutoff frequency fcut of the low pass filter.

The band pass filter according to the first embodiment, depicted in FIG. 1, is applied to a single phase signal, but the band pass filter may be applied to a differential signal, as described below.

Figure 3:
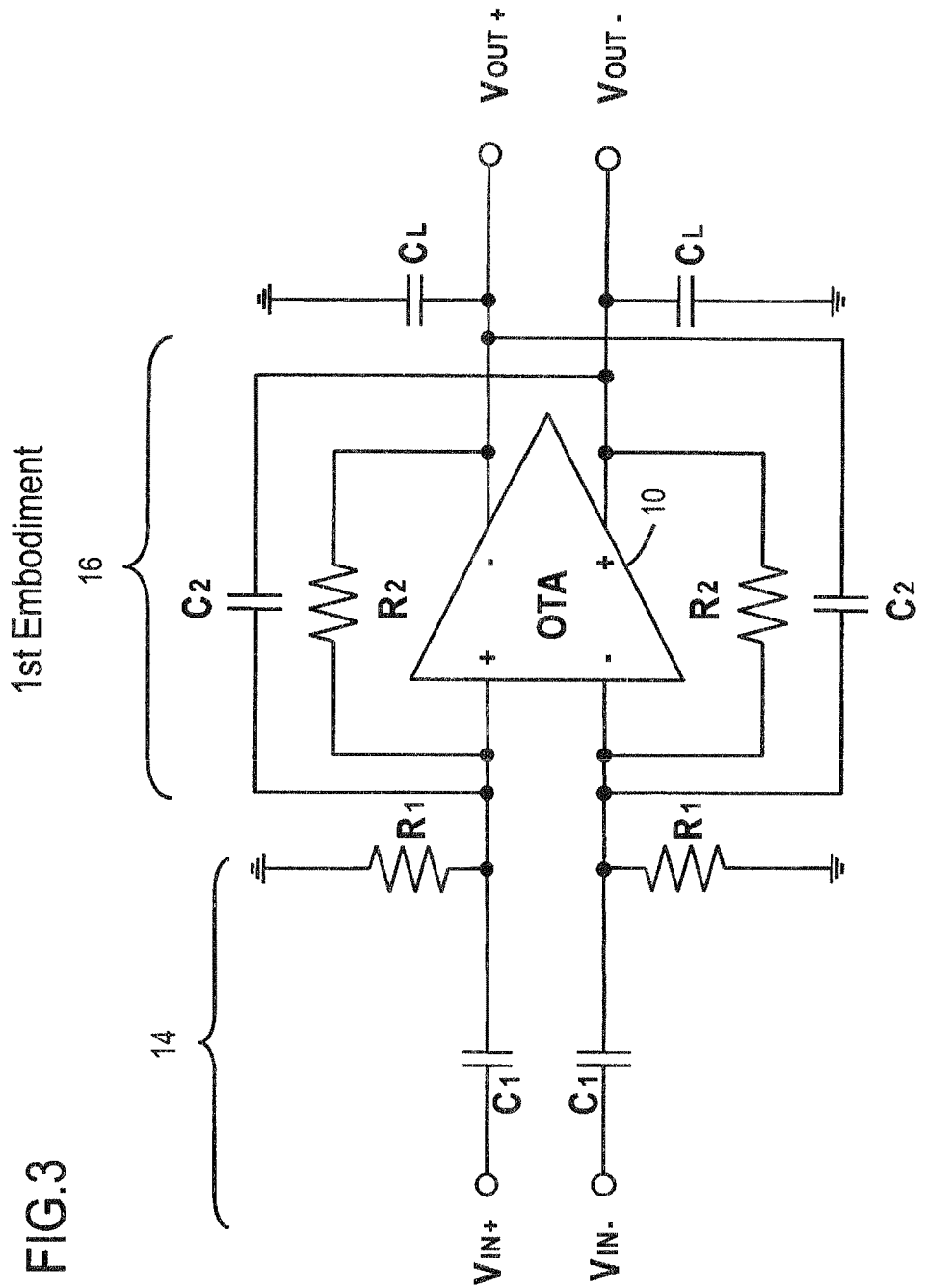
FIG. 3 is a circuit diagram depicting a band pass filter applied to a differential signal, according to the first embodiment.

FIG. 3 is a circuit diagram depicting a band pass filter applied to a differential signal, according to the first embodiment. In the drawing, an element connected to the non-inverting input terminal (a positive electrode input terminal) of the differential amplifier 10 will be referred to as a positive side, and an element connected to the inverting input terminal (a negative electrode input terminal) will be referred to as a negative side.

In the band pass filter, differential input signals Vin+, Vin− are input into one electrode of second positive side and negative side capacitors C1 of the high pass filter 14. The other electrode of the second positive side and negative side capacitors C1 is connected to the non-inverting input terminal (positive electrode input terminal) and the inverting input terminal (negative electrode input terminal) of the differential amplifier 10.

The differential amplifier 10 is an OTA (Operational Transconductance Amplifier), for example. A first negative side resistor R2 is connected between a non-inverting output terminal (a positive electrode output) and the inverting input terminal (negative electrode input) of the differential amplifier 10, and one terminal of a first negative side capacitor C2 is connected to the inverting input terminal (negative electrode input). The other terminal of the first negative side capacitor C2 is connected to an inverting output terminal (a negative electrode output) of the differential amplifier 10.

Similarly to the above, a first positive side resistor R2 is connected between the inverting output terminal (negative electrode output) and the non-inverting input terminal (positive electrode input) of the differential amplifier 10, one terminal of a second positive side capacitor C2 is connected to the non-inverting input terminal (positive electrode input), and the other terminal of the second positive side capacitor C2 is connected to the non-inverting output terminal (positive electrode output).

When one terminal of the first positive side capacitor C2 is connected to the non-inverting input (positive electrode input), the other terminal thereof is connected to the non-inverting output terminal (positive electrode output), one terminal of the first negative side capacitor C2 is connected to the inverting input (negative electrode input), and the other terminal thereof is connected to the inverting output terminal (negative electrode output), as described above, an output differential signal is inverted. This is equivalent to the constitution depicted in FIG. 1, where the output of the amplifier 10 is connected to the first capacitor C2 after being subjected to polarity inversion by the inverting amplifier 12.

Differential output signals Vout+, Vout− are output to the output terminal pair of the differential amplifier. In the circuit diagram of FIG. 3, load capacitors CL are depicted respectively on the output pair of the differential output signals Vout+, Vout−.

Figure 4:
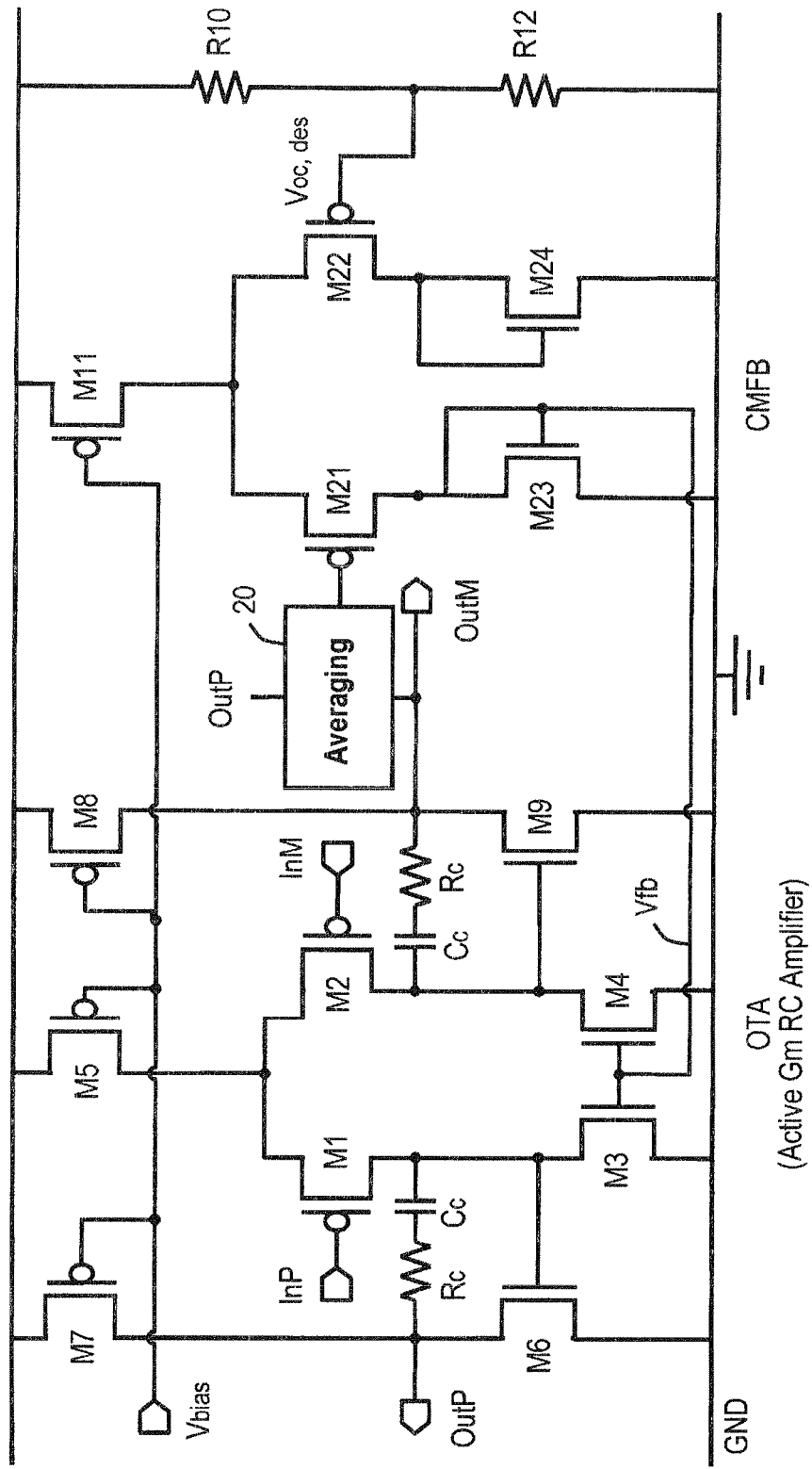
FIG. 4 is a circuit diagram of the OTA constituting the differential amplifier 10 of FIG. 3.

FIG. 4 is a circuit diagram of the OTA constituting the differential amplifier 10 of FIG. 3. In the drawing, the left side depicts the OTA and the right side depicts a common mode feedback circuit CMFB. The OTA on the left side is an Active Gm RC amplifier.

For example, the OTA includes a differential circuit formed from: a current source circuit constituted by a P channel MOS transistor M5 having a gate to which a bias voltage Vbias is supplied; P channel MOS transistors M1, M2 having gates into which differential inputs InP, InM are input; and N channel MOS transistors M3, M4 having gates to which a common mode feedback voltage Vfb is supplied. Further, the OTA includes a current source circuit constituted by P channel MOS transistors M7, M8, an output stage circuit constituted by source-grounded N channel MOS transistors M6, M9 having gates to which drains of the transistors M1, M2 are respectively connected, and CR circuits Cc, Rc provided respectively between the drains of the transistors M1, M2 and output terminals OutP, OutM.

The common mode feedback circuit CMFB, meanwhile, includes an averaging circuit 20 for generating a common mode voltage, which is an average voltage of the output signals OutP, OutM of the OTA, and resistors R10, R12 provided between a power supply VDD and a reference voltage ground VSS in order to generate a desired common mode voltage Voc.des. Furthermore, the common mode feedback circuit CMFB includes a P channel MOS transistor M21 having a gate to which a common mode voltage of a differential output signal generated by the averaging circuit 20 is applied, a P channel MOS transistor M22 having a gate to which the desired common mode voltage Voc.des is applied, and N channel MOS transistors M23, M24. A drain voltage of the transistor M21 is applied as a feedback voltage Vfb to gates of the transistors M3, M4 forming a load circuit of the OTA.

When the feedback voltage Vfb rises, the transistors M3, M4 become more conductive such that the common mode voltage of the output signals OutP, OutM of the OTA decreases. When the Vfb falls, on the other hand, the common mode voltage increases. As a result, the common mode voltage of the output signals OutP, OutM of the OTA can be aligned with the desired common mode voltage Voc.des.

The band pass filters depicted in FIGS. 1 and 3 differ from a conventional band pass filter as follows. When a band pass filter is constructed by combining a high pass filter and a low pass filter, it is typically necessary to make the unity gain frequency fu, at which the gain of the low pass filter reaches 1, considerably larger than the center frequency fcent (ten times larger than the center frequency fcent, for example). For example, setting is performed to obtain a characteristic LPF1 corresponding to a unity gain frequency fu1 depicted in FIG. 2. In so doing, a frequency characteristic of the low pass filter at the center frequency fcent of the band pass filter can be flattened, and as a result, the gain can be increased sufficiently.

However, to enable the OTA constituting the low pass filter to operate up to a high frequency band, a drain current of an amplifying transistor constituting the OTA may be increased in order to increase the gm thereof, and as a result, an increase in current consumption occurs.

To respond to this problem, the unity gain frequency fu0 of the low pass filter 16 in the band pass filters depicted in FIGS. 1 and 3 is reduced to two or three times the center frequency fcent of the band pass filter, as depicted in FIG. 2. In other words, the cutoff frequency fcut of the low pass filter 16 is aligned with the center frequency fcent of the band pass filter.

Since the unity gain frequency can be reduced to fu0 in this manner, the OTA constituting the low pass filter does not need to operate in a high frequency band, and therefore the gm can be reduced by reducing the drain currents of the transistors M1, M2 generated by the transistor M5. In other words, in this embodiment, the current of the transistor M5 of the OTA can be reduced such that the unity gain frequency fu0 falls to approximately two to three times the center frequency fcent. This is a first reason why it is possible to save power.

Note, however, that when the unity gain frequency fu0 is reduced, the gain at the center frequency fcent also decreases. Hence, in the band pass filters depicted in FIGS. 1 and 3, the output of the OTA forming the low pass filter 16 is inverted before being supplied to the capacitor C2. With this configuration, a Q value can be increased, as depicted by a Q value formula to be described below, and as a result, the gain at the center frequency fcent can be increased sufficiently.

A second reason why it is possible to save power is that the second order low pass filter 16 is constituted by a single OTA. In a second order low pass filter, two capacitors are provided to set an order of an s variable in a denominator of a transfer function at 2. For this purpose, in "Tien-Yu Lo, Chuan-Cheng Hsiao, Kang-Wei Hsuch, and Hung-Sung Li, "A 1-V 60 MHz Bandpass Filter with Quality-Factor Calibration in 65 nm CMOS", Proc. Of IEEE Asia Solid-State Circuit Conference, pp. 53-56, 2009", two OTAs respectively provided with a feedback resistor and a feedback capacitor are connected.

In the band pass filters of FIGS. 1 and 3, on the other hand, the single OTA constituting the low pass filter 16 is formed from a Gm RC amplifier, and by increasing the capacitance of the capacitor Cc in the CR circuit of the OTA, an impedance $1/j\omega Cc$ thereof is reduced such that the s variable in the denominator of a transfer function H(s) takes the second order. In other words, using a single OTA, a second order low pass filter is formed from the capacitor Cc in the OTA and the feedback capacitor C2 of the OTA. Hence, a second order low pass filter can be formed from a single OTA and a fourth order low pass filter can be formed from two OTAs, thereby halving the number of OTAs in comparison with Tien-Yu Lo, Chuan-Cheng Hsiao, Kang-Wei Hsuch, and Hung-Sung Li, "A 1-V 60 MHz Bandpass Filter with Quality-Factor Calibration in 65 nm CMOS", Proc. Of IEEE Asia Solid-State Circuit Conference, pp. 53-56, 2009. As a result, the current consumption can also be halved.

The transfer function of the band pass filters depicted in FIGS. 1 and 3 is as depicted in Equation (1). Here, A, Q, and $\omega c$ denote the filter gain, the Q value, and the center frequency, and these parameters are as depicted in Equations (2), (3), and (4).

$$H(s) = -\frac{A \cdot \frac{\omega_c}{Q} s}{s^2 + \frac{\omega_c}{Q} s + \omega_c^2} \quad (1)$$

$$A = \frac{\omega_u R_1 R_2 C_1}{R_1 + R_2 - \omega_u R_1 R_2 C_2} \quad (2)$$

$$Q = \frac{R_1 \sqrt{\omega_u R_2 (C_1 + C_2)}}{R_1 + R_2 - \omega_u R_1 R_2 C_2} \quad (3)$$

$$\omega_c^2 = \frac{\omega_u}{R_2(C_1 + C_2)} \quad (4)$$

As depicted in Equation (5), $\omega u$ denotes the unity gain frequency (radian/second) of the OTA in the active Gm RC filter, and therefore the transfer function of the OTA is as depicted in Equation (6).

$$\omega_u = \frac{1}{k_g R_1 C_C} \quad (5)$$

$$A_{ota}(s) \approx \frac{\omega_u}{s} \quad (6)$$

In the transfer function of Equation (1), the numerator has a first order s variable, and it is therefore evident that the circuits depicted in FIGS. 1 and 3 have a band pass filter characteristic. Further, the denominator of the transfer function depicted in Equation (1) has a second order s variable, and it is therefore evident that the circuits depicted in FIGS. 1 and 3 are second order band pass filters. In the transfer function of the OTA depicted in Equation (6), the denominator has a first order s variable, and it is therefore evident that the capacitor Cc in the RC circuit of the OTA has effective impedance.

Further, by providing the inverting amplifier 12 for inverting the polarity of the output of the differential amplifier 10, a third term of the denominator of the Q value depicted in Equation (3) becomes $-\omega u R_1 R_2 C_2$, i.e. takes a negative sign, and therefore the denominator of the Q value is smaller than that of a comparative example to be described below. In other words, the Q value is larger than that of the comparative example, and therefore, even when the unity gain frequency fu0 is set at two to three times the center frequency fcent by reducing the power consumption of the OTA, the band pass characteristic can be sharpened. As a result, a sufficient gain can be obtained at the center frequency fcent, and a bandwidth can be narrowed.

In other words, similarly to the gain equation depicted in Equation (2), the third item of the denominator is $-\omega u R_1 R_2 C_2$, i.e. takes a negative sign, and therefore the gain increases.

Figure 5:
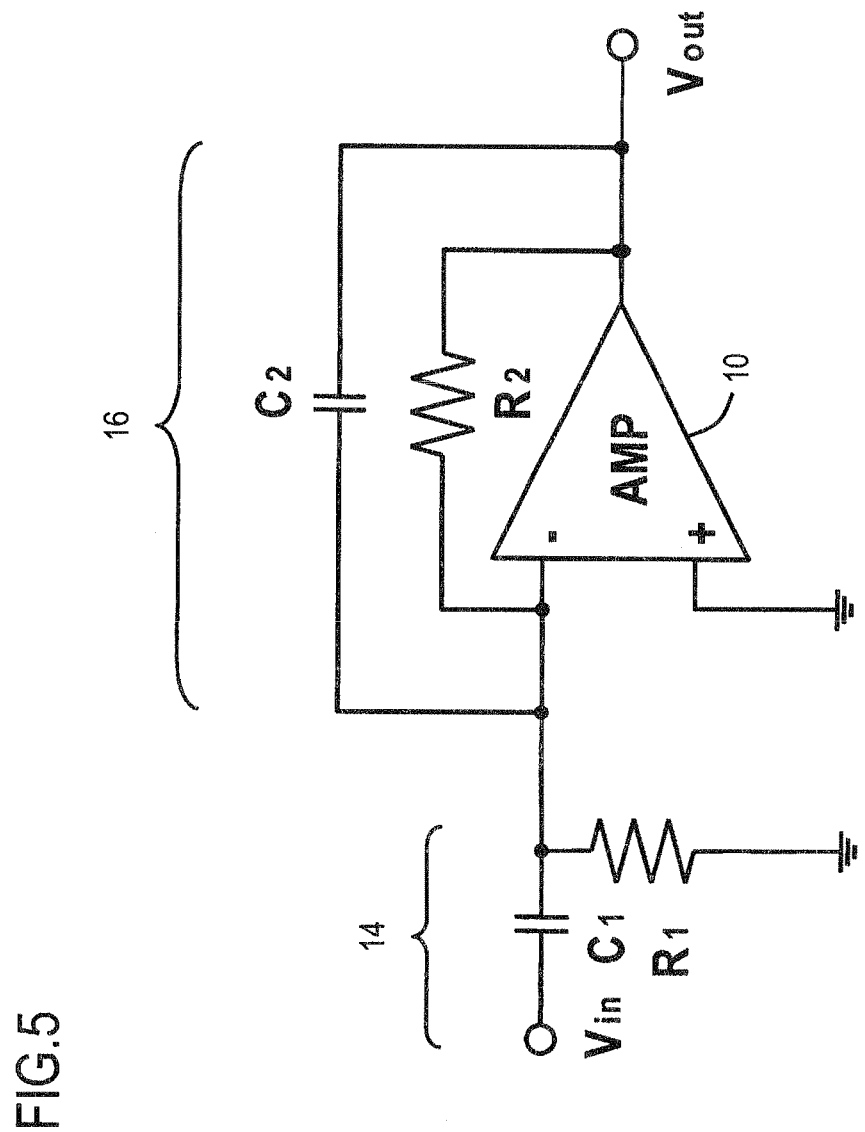
FIG. 5 is a circuit diagram depicting the band pass filter according to the comparative example.

FIG. 5 is a circuit diagram depicting the band pass filter according to the comparative example. This comparative example differs from the circuit depicted in FIG. 1 in that the inverting amplifier 12 is not provided. Likewise in the comparative example depicted in FIG. 5, the band pass filter is formed from the high pass filter 14, and the low pass filter 16 constituted by the amplifier 10, the feedback resistor R2, and the capacitor C2.

As regards the Q value of the comparative example, however, the third item of the denominator in Equation (3) is +ωu R1 R2 C2, i.e. takes a positive sign. This means that the Q value in Equation (3) relating to the band pass filters depicted in FIGS. 1 and 3 is higher than the Q value of the comparative example. Similarly, the gain A is higher than that of the comparative example.

As described above, with the band pass filter according to the first embodiment, even though the unity gain frequency fu0 of the OTA is reduced, the Q value can be increased by inverting the output signal of the differential amplifier before supplying the output signal to the first capacitor C2. Hence, a sufficient gain can be maintained at the center frequency fcent without an increase in power.

Second Embodiment

Figure 6:
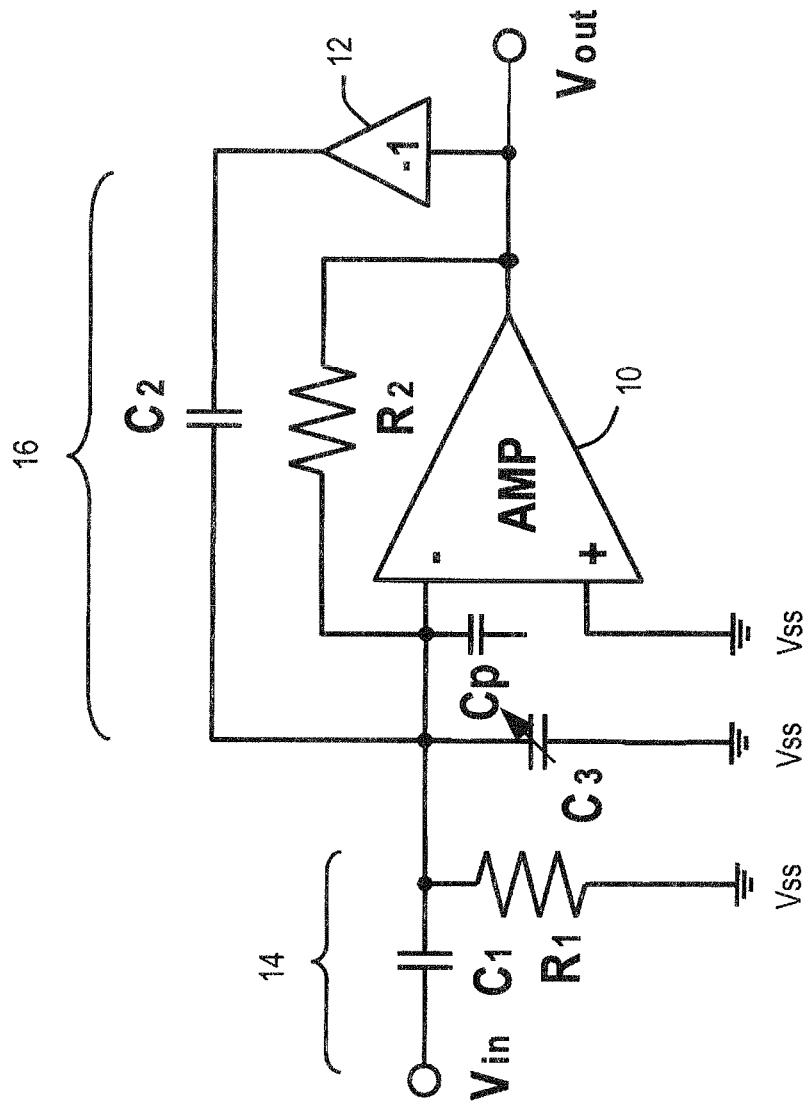
FIG. 6 is a circuit diagram depicting a band pass filter according to a second embodiment.

FIG. 6 is a circuit diagram depicting a band pass filter according to a second embodiment. This band pass filter likewise includes the high pass filter 14 and the low pass filter 16 constituted by the amplifier 10, the second resistor R2, the second capacitor C2, and the inverting operational amplifier 12. Furthermore, this band pass filter includes a variable capacitance capacitor C3 that is provided between the inverting input terminal (negative electrode input) of the amplifier 10 and the reference voltage Vss such that a capacitance thereof can be varied.

The second capacitor C2 is connected to the inverting input terminal (negative electrode input) of the amplifier 10. Further, a parasitic capacitance Cp is typically formed in the inverting input terminal. An effective capacitance value of the second capacitor C2 is varied by the parasitic capacitance Cp, leading to variation in the center frequency of the band pass filter.

Hence, in the second embodiment, the variable capacitance capacitor C3 capable of capacitance variation is provided between the inverting input terminal of the amplifier 10 and the reference voltage Vss, as described above. By adjusting the capacitance value of the variable capacitance capacitor C3, the center frequency can be adjusted to a desired frequency. An adjustment method will be described below.

Figure 7:
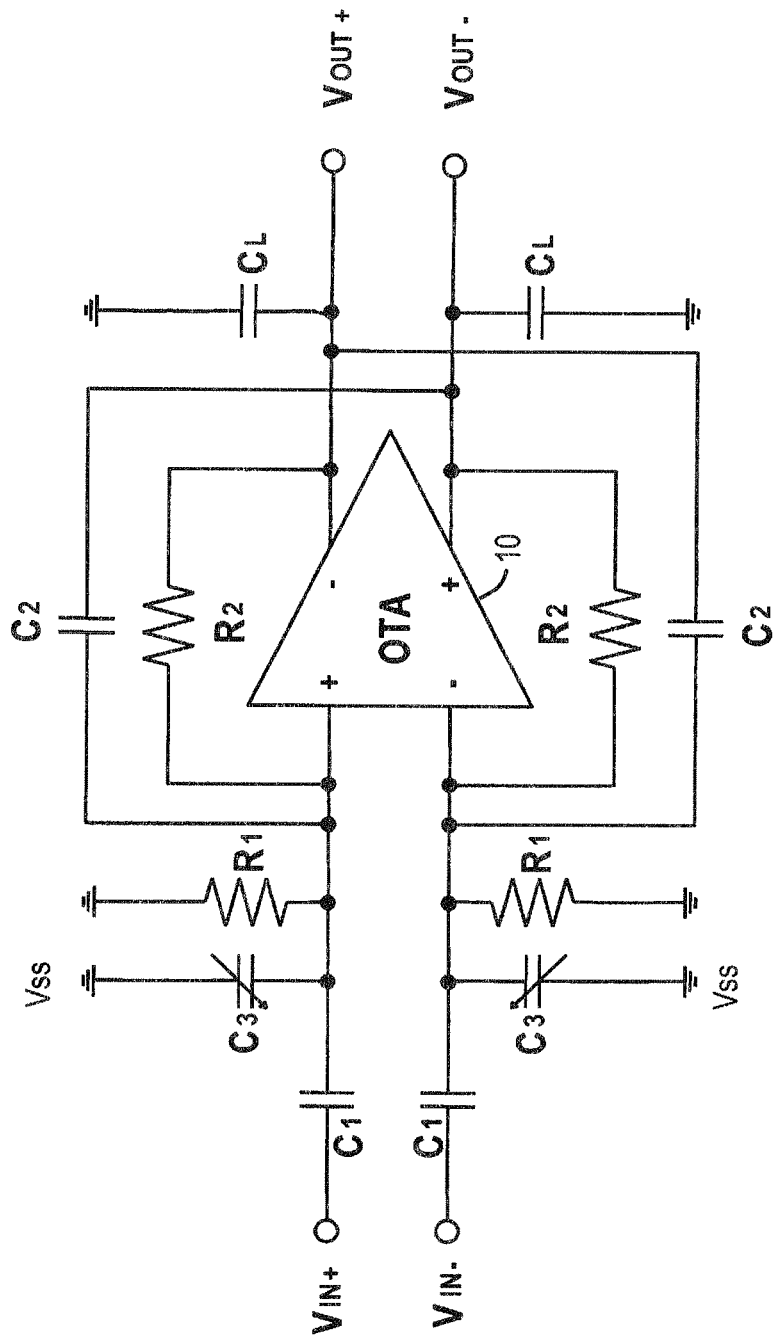
FIG. 7 is a circuit diagram depicting a band pass filter having a differential configuration, according to the second embodiment.

FIG. 7 is a circuit diagram depicting a band pass filter having a differential configuration, according to the second embodiment. As depicted in FIG. 7, in this differential band pass filter, variable capacitance capacitors C3 capable of capacitance variation are provided respectively between the two input terminals of the differential amplifier 10 and the reference potential ground Vss. By adjusting the capacitance values of the two capacitors C3, the center frequency can be set at a desired frequency.

A transfer function of the band pass filters depicted in FIGS. 6 and 7 is as depicted below in Equation (7). Here, A, Q, and ωc denote the filter gain, the Q value, and the center frequency, and these parameters are as depicted in Equations (8), (9), and (10).

$$H(s) = -\frac{A \cdot \frac{\omega_c}{Q} s}{s^2 + \frac{\omega_c}{Q} s + \omega_c^2} \quad (7)$$

$$A = \frac{\omega_u R_1 R_2 C_1}{R_1 + R_2 - \omega_u R_1 R_2 C_2} \quad (8)$$

$$Q = \frac{R_1 \sqrt{\omega_u R_2 (C_1 + C_2 + C_3)}}{R_1 + R_2 - \omega_u R_1 R_2 C_2} \quad (9)$$

$$\omega_c^2 = \frac{\omega_u}{R_2 (C_1 + C_2 + C_3)} \quad (10)$$

As depicted in Equation (11), ωu denotes the unity gain frequency (radian/second) of the OTA in the active Gm RC filter, and therefore the transfer function of the OTA is as depicted in Equation (12).

$$\omega_u = \frac{1}{k_g R_1 C_C} \quad (11)$$

$$A_{ota}(s) \approx \frac{\omega_u}{s} \quad (12)$$

In the transfer function of Equation (7), similarly to Equation (1), the numerator has a first order s variable, and it is therefore evident that the circuits depicted in FIGS. 6 and 7 have a band pass filter characteristic. Further, the numerator has a second order s variable, and it is therefore evident that the circuits depicted in FIGS. 6 and 7 are second order band pass filters.

Furthermore, the third term of the denominator of the Q value depicted in Equation (9) becomes −ωu R1 R2 C2, i.e. takes a negative sign, and therefore the denominator of the Q value is smaller than that of the comparative example described above. In other words, the Q value is larger than that of the comparative example, and therefore, even when the unity gain frequency fu0 is set at two to three times the center frequency fcent by reducing the power consumption of the OTA, the band pass characteristic can be sharpened. As a result, a sufficient gain can be obtained at the center frequency fcent, and the bandwidth can be narrowed. Likewise, similarly to the gain equation depicted in Equation (8), the third item of the denominator is −ωu R1 R2 C2, i.e. takes a negative sign, and therefore the gain increases.

Third Embodiment

Figure 8:
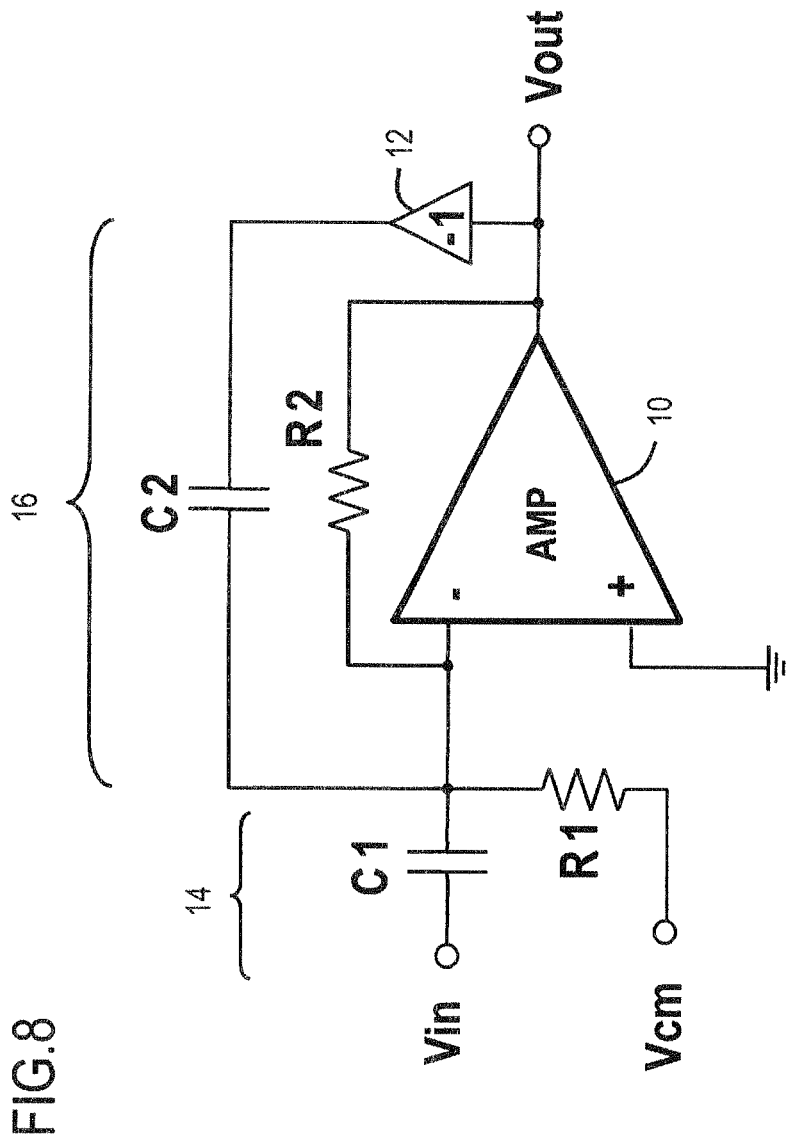
FIG. 8 is a circuit diagram depicting a band pass filter according to a third embodiment.

FIG. 8 is a circuit diagram depicting a band pass filter according to a third embodiment. This band pass filter likewise includes the high pass filter 14 and the low pass filter 16 constituted by the amplifier 10, the second resistor R2, the second capacitor C2, and the inverting amplifier 12. Further, in this band pass filter, the second resistor R1 of the high pass filter 14 is provided between the non-inverting input terminal (negative electrode input) of the amplifier 10 and a common mode voltage Vcm. The constitution of the connection to the common mode voltage Vcm differs from FIGS. 1 and 6.

When the common mode voltage of the non-inverting input terminal of the amplifier 10 is unstable, the gain of the band pass filter becomes unstable. Hence, by supplying the common mode voltage Vcm to the other end of the second resistor R1, the common mode voltage of the non-inverting input terminal of the amplifier 10 is stabilized, and as a result, variation in the gain of the band pass filter can be suppressed.

Figure 9:
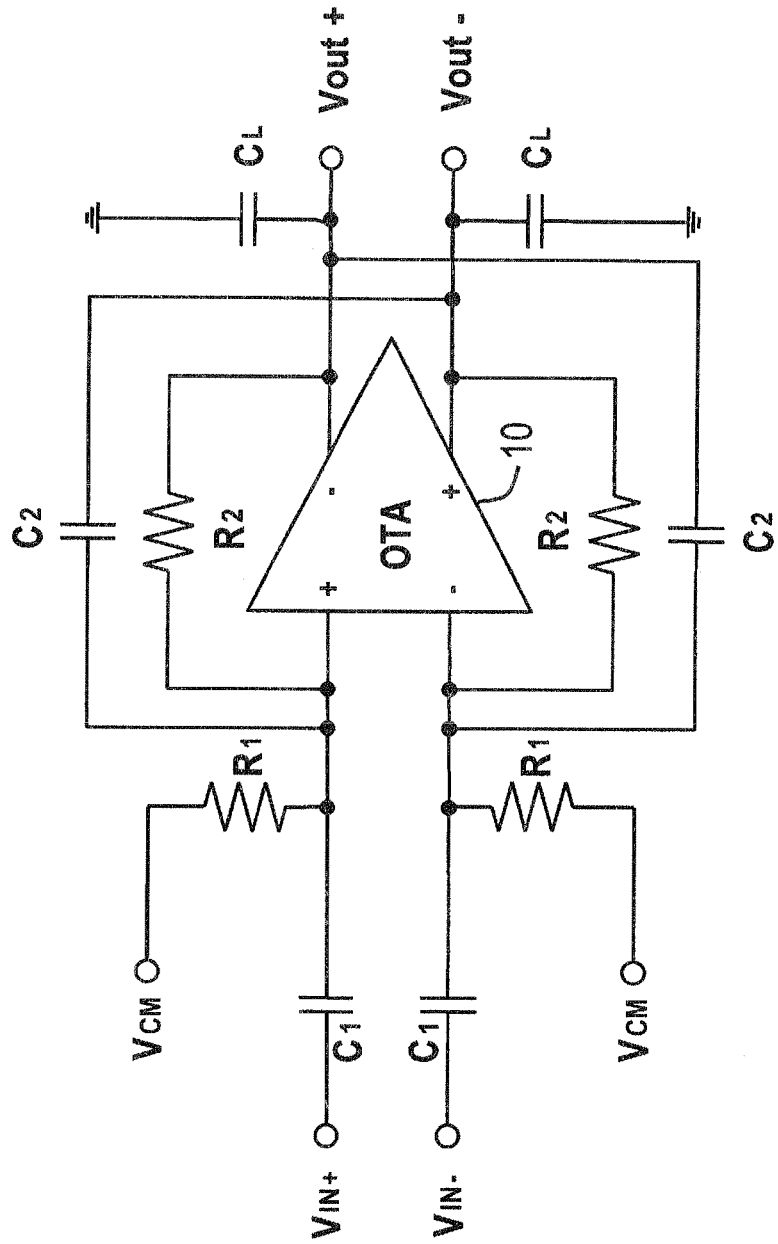
FIG. 9 is a circuit diagram depicting a band pass filter having a differential configuration, according to the third embodiment.

FIG. 9 is a circuit diagram depicting a band pass filter having a differential configuration, according to the third embodiment. As depicted in FIG. 9, in this differential band pass filter, the common mode voltage VCM is applied to the other end of the second positive side and negative side resistors R1 connected to the two input terminals of the differential amplifier 10. As a result, the common mode voltage of the two input terminals of the differential amplifier 10 is stabilized such that variation in the gain of the band pass filter is suppressed.

Fourth Embodiment

Figure 10:
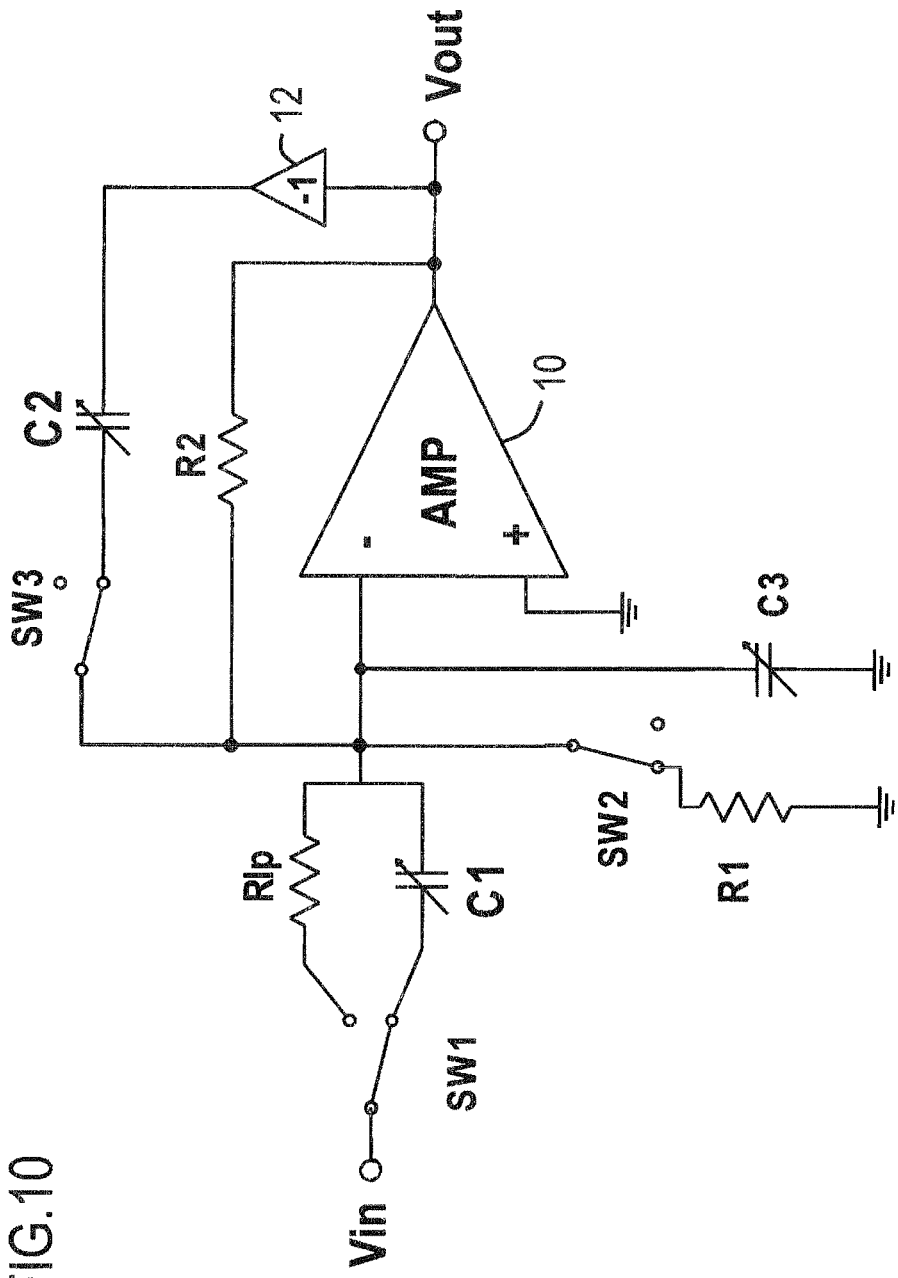
FIG. 10 is a circuit diagram depicting a band pass filter according to a fourth embodiment.

FIG. 10 is a circuit diagram depicting a band pass filter according to a fourth embodiment. The fourth embodiment is a circuit applied to a case in which the center frequency of the band pass filter is adjusted using the adjustment variable capacitance capacitor C3 provided in the second embodiment, depicted in FIG. 6. It is not always efficient to adjust the capacitance value of the variable capacitance capacitor C3 while measuring the center frequency, and therefore, in the fourth embodiment, adjustment of the capacitance value of the variable capacitance capacitor C3 is simplified.

The band pass filter depicted in FIG. 10 is formed by adding switches SW1, SW2, SW3 and a resistor R1p to the circuit depicted in FIG. 6. The switch SW1 to the resistor R1p side, the resistor R1 is disconnected from the inverting input terminal by switching the switch SW2 OFF, and the feedback resistor C2 is disconnected by switching the switch SW3 OFF. In this state, the circuit forms a low pass filter in which the input resistor R1p and the feedback resistor R2 are provided in the inverting input terminal of the amplifier 10.

The transfer function of the low pass filter is as depicted in Equation (13). The parameters thereof are as depicted in Equations (14) to (16).

$$H_{LP}(s) = -\frac{A\omega_o^2}{s^2 + \frac{\omega_o}{Q}s + \omega_o^2} \quad (13)$$

$$A_{DC} = \frac{R_2}{R_{lp}} \quad (14)$$

$$Q = \frac{1}{1 + A_{DC}}\sqrt{\omega_u R_2 C_3} \quad (15)$$

$$\omega_o^2 = \frac{\omega_u}{R_2 C_3} \quad (16)$$

The denominator of the transfer function in Equation (13) does not include s, and it is therefore evident that the circuit is a low pass filter.

The cutoff frequency of the low pass filter matches the center frequency of the band pass filter, and therefore the capacitance value of the variable capacitance capacitor C3 is adjusted such that the cutoff frequency of the low pass filter reaches a desired frequency.

Further, as will be described below, a ring oscillator is formed by the low pass filter formed by controlling the switches SW1, SW2, SW3. And using the fact that an oscillation frequency of the ring oscillator matches the cutoff frequency, the capacitance of the variable capacitance capacitor C3 is adjusted such that the oscillation frequency reaches a desired frequency. Moreover, capacitance values of the capacitors C1, C2 are preferably adjusted in conjunction with the operation to adjust of the capacitance value of the variable capacitance capacitor C3 while maintaining a ratio between the capacitance values of C1, C2, C3.

The circuit of the band pass filter depicted in FIG. 6 is formed from the circuit depicted in FIG. 10 by switching the switch SW1 to the capacitor C1 side and switching the switch SW2 ON in order to connect the resistor R1, and switching the switch SW3 ON in order to connect the capacitor C2 to the inverting input terminal side of the amplifier 10.

Figure 11:
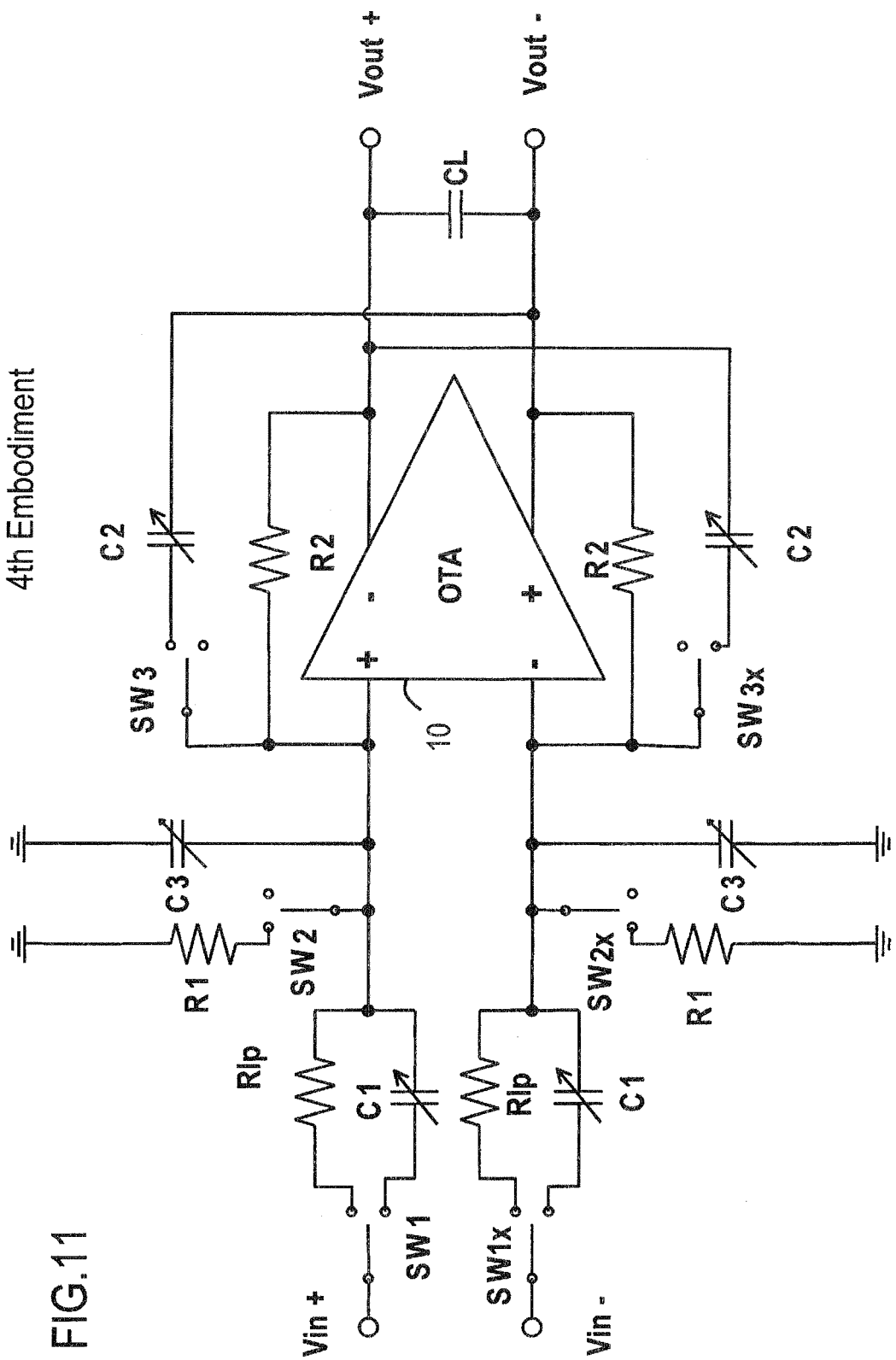
FIG. 11 is a circuit diagram depicting a band pass filter having a differential configuration, according to the fourth embodiment.

FIG. 11 is a circuit diagram depicting a band pass filter having a differential configuration, according to the fourth embodiment. In FIG. 11, switches SW1, SW1x, SW2, SW2x, SW3, SW3x and the input side resistor R1p of FIG. 10 are added to the circuit depicted in FIG. 7. By connecting the switches SW1, SW1x to the resistor R1p side and switching the switches SW2, SW2x, SW3, SW3x OFF, a low pass filter having a differential configuration is formed. By connecting the switches SW1, SW1x to the capacitor C1 side and switching the switches SW2, SW2x, SW3, SW3x ON, on the other hand, a similar differential band pass filter to that of FIG. 7 is formed.

Figure 12:
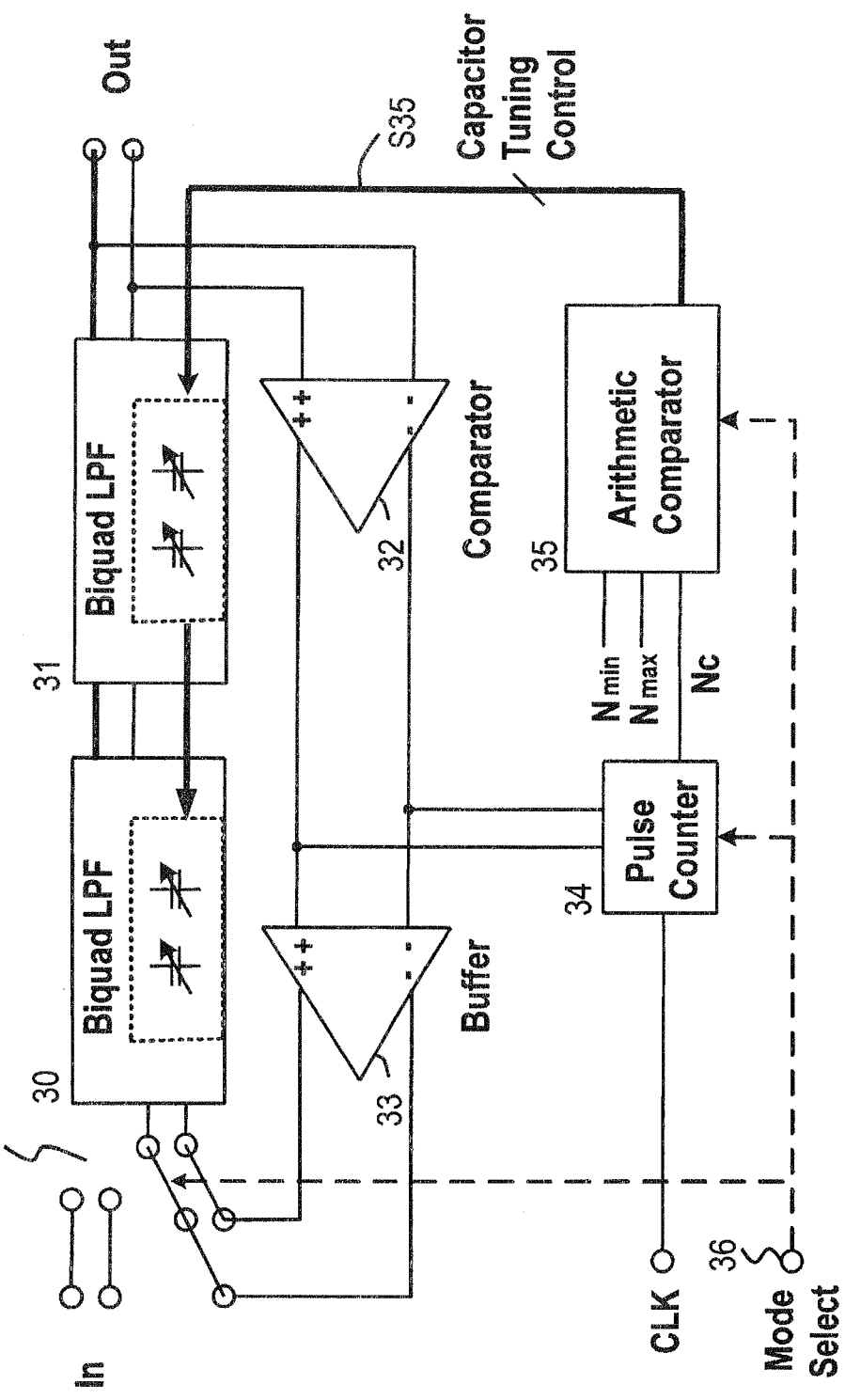
FIG. 12 is a diagram of a circuit for calibrating the center frequency using the variable capacitance capacitor C3.

FIG. 12 is a diagram of a circuit for calibrating the center frequency using the variable capacitance capacitor C3. FIG. 12 depicts a ring oscillator including two low pass filters 30, 31 formed by controlling the switches of the circuit depicted in FIG. 11, and a comparator 32 and a buffer 33 connected thereto in a ring shape. In other words, the circuits are set in a ring configuration by connecting an input terminal of the low pass filter 30 to an output terminal side of the buffer 33 using the switch SW4.

As described with reference to FIG. 11, a normal band pass filter is formed by constituting the two low pass filters 30, 31 to a band pass filter and connecting the switch SW4 to an input terminal In side. This band pass filter is a fourth order band pass filter in which two second order biquad filters 30, 31 are connected in series.

A counter 34 for counting the oscillation frequency of the ring oscillator and a calculator 35 for generating a control signal for adjusting the capacitance values of the capacitors C1, C2, C3 in accordance with a count value Nc of the counter 34 are provided in the calibration circuit diagram of FIG. 12. The calculator generates a control signal S35 for controlling the capacitance value of the variable capacitance capacitor C3 so that the count value Nc corresponding to the oscillation frequency of the ring oscillator enters a desired count value range Nmin to Nmax. In other words, the capacitance value of the variable capacitance capacitor C3 is adjusted such that the oscillation frequency of the ring oscillator reaches a desired frequency.

Figure 13:
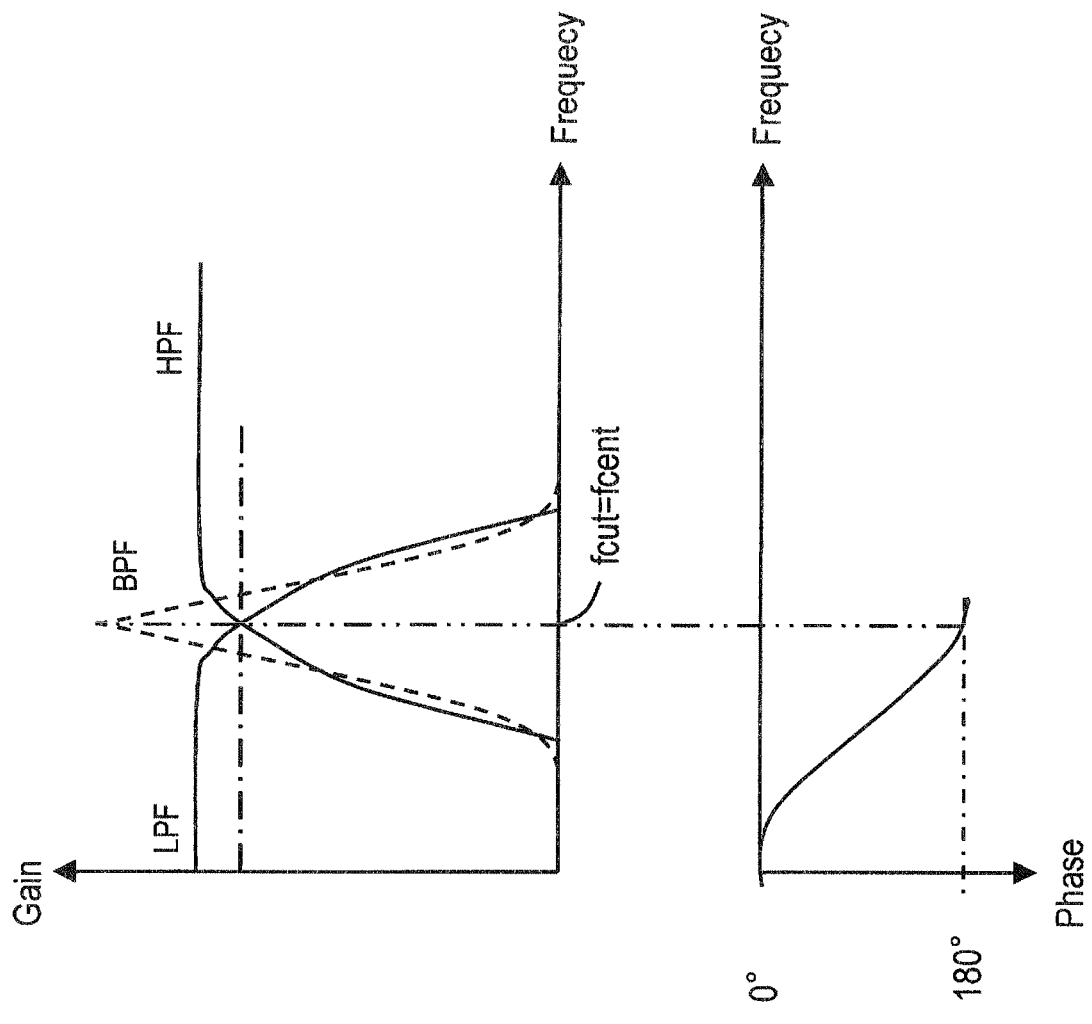
FIG. 13 is a view illustrating an oscillation operation of the calibration ring oscillator depicted in FIG. 12.

FIG. 13 is a view illustrating an oscillation operation of the calibration ring oscillator depicted in FIG. 12. The low pass filters 30, 31 pass low frequency input signals and attenuate high frequency input signals. A phase deviation occurs between an input signal and an output signal, and this phase deviation is dependent on the frequency of the passing signal. In one low pass filter 30 or 31, a 90° phase deviation occurs between the input signal and the output signal with respect to a signal having the cutoff frequency. Therefore, in a case where the two low pass filters 30, 31 are connected, a signal having the cutoff frequency undergoes a 180° phase deviation when passing through the two low pass filters. A 180° phase deviation means that a differential signal is inverted. In other words, signals having the cutoff frequency are transmitted by ring oscillation.

An upper side of FIG. 13 depicts a relationship between the gain characteristic of a low pass filter LPF and the cutoff frequency Fcut, while the lower side depicts the phase deviation between two low pass filters LPF relative to the frequency. As described above, a signal having the cutoff frequency fcut undergoes a 180° phase deviation when it passes through the two low pass filters, and as a result, the polarity of the signal is inverted. Hence, in the circuit depicted in FIG. 12, signals having an equal frequency to the cutoff frequency are transmitted by ring oscillation. Accordingly, the frequency of the signals transmitted by ring oscillation is equal to the cutoff frequency fcut of the low pass filter.

Further, as described above, the cutoff frequency fcut of the low pass filter is equal to the center frequency fcent of the band pass filter. Therefore, by adjusting the capacitance value of the variable capacitance capacitor C3 such that the frequency Nc of the signal transmitted by ring oscillation in FIG. 12 enters the desired frequency range Nmin to Nmax, the center frequency fcent of the band pass filter can be adjusted to a desired frequency range.

In FIG. 12, when a mode selection signal 36 is set in an adjustment mode, a low pass filter is constructed by controlling the switches SW1, SW2, SW3 in the manner described above, and a ring oscillator is constructed by connecting the input terminal of the low pass filter 30 to the output of the buffer 33 using the switch SW4. In the ring oscillator, the two low pass filters 30, 31, the comparator 32, and the buffer 33 are connected in a ring shape such that a differential signal is not inverted. A signal having an equal frequency to the cutoff frequency of the low pass filters 30, 31 then undergoes a 90° phase deviation in each low pass filter such that the phase of the differential signal is caused to deviate 180° by the two low pass filters. As a result, the circuit connected in a ring shape forms a ring oscillator in relation to signals having the cutoff frequency. Accordingly, signals having an equal frequency to the cutoff frequency are transmitted by ring oscillation.

When the ring oscillator is constructed as described above, the calculation circuit 35 generates the control signal S35 for adjusting the capacitance value of the variable capacitance capacitor C3 such that the count value Nc corresponding to the oscillation frequency of the ring oscillator enters the desired frequency range.

In the adjustment mode, the capacitance values of the first capacitor C2 and the second capacitor C1 are adjusted in addition to the capacitance value of the variable capacitance capacitor C3 and in a similar manner thereto, while maintaining respective capacitance ratios relative to the capacitor C3. The first and second capacitors C2, C1 are designed with desired capacitance values in an initial state prior to adjustment. In the adjustment mode, the first and second capacitors C2, C1 are disconnected from the low pass filter circuit. However, the capacitance values of the first and second capacitors C2, C1 are adjusted at the same time as that of the variable capacitance capacitor C3 while maintaining their respective capacitance ratios.

Figure 14:
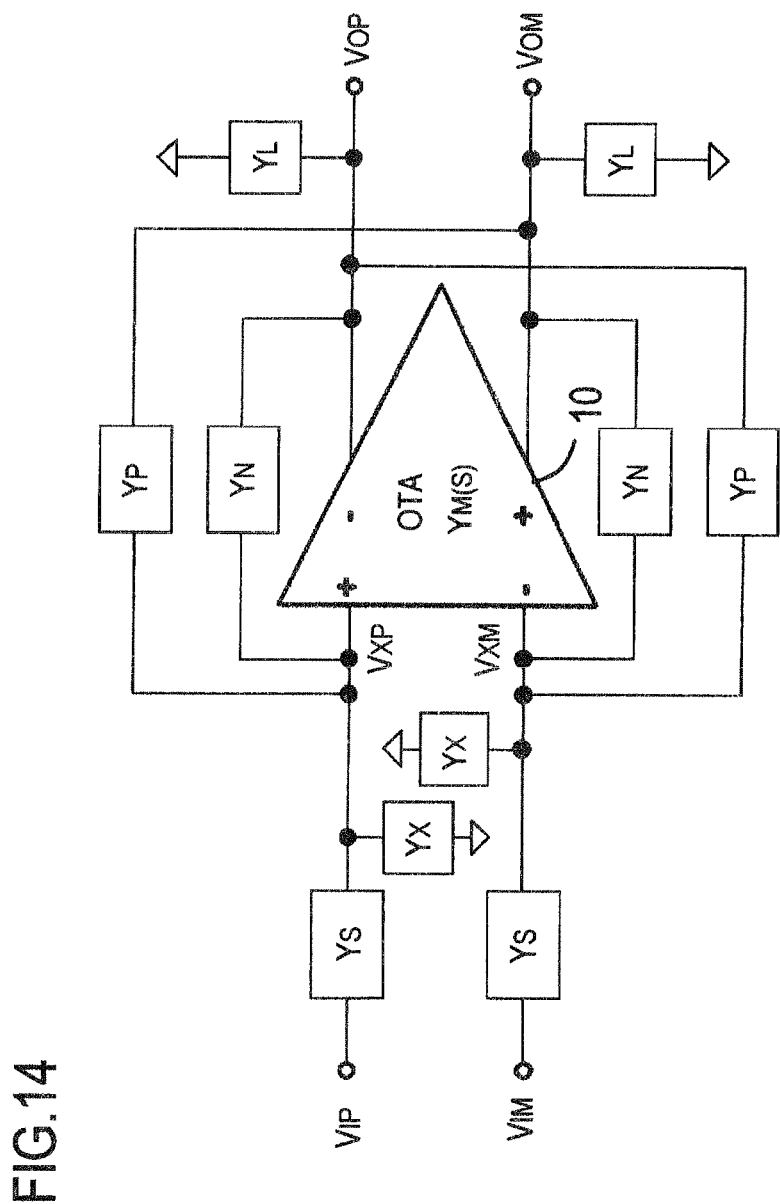
FIG. 14 is a diagram depicting a circuit constructed by forming the differential band pass filters of the first, second, and third embodiments, depicted in FIGS. 3, 7, and 9, from admittances Y.

FIG. 14 is a diagram depicting a circuit constructed by forming the differential band pass filters of the first, second, and third embodiments, depicted in FIGS. 3, 7, and 9, from admittances Y. In the band pass filter of FIG. 14, first admittances Ys are provided respectively between a positive electrode input terminal $V_{IP}$ and a positive electrode input terminal $V_{XP}$ of an OTA and between a negative electrode input terminal $V_{IM}$ and a negative electrode input terminal $V_{XM}$ of the OTA, second admittances Yx are connected respectively to the positive electrode input terminal $V_{XP}$ and the negative electrode input terminal $V_{XM}$, third admittances YP are provided respectively between a positive electrode output terminal $V_{OP}$ and the positive electrode input terminal $V_{XP}$ of the OTA and between a negative electrode output terminal $V_{OM}$ and the negative electrode input terminal $V_{XM}$ of the OTA, fourth admittances YN are provided respectively between the negative electrode output terminal $V_{OM}$ and the positive electrode input terminal $V_{XP}$ of the OTA and between the positive electrode output terminal $V_{OP}$ and the negative electrode input terminal $V_{XM}$ of the OTA, and fifth admittances YL are connected respectively to the positive electrode output terminal $V_{OP}$ and the negative electrode output terminal $V_{OM}$.

In the band pass filters of FIGS. 3 and 9, the first to fifth admittances take the following formulae.

$Ys = sC1$ $Yx = 1/R1$ $YP = sC2$ $YN = 1/R2$ $YL = sCL$

In the band pass filter of FIG. 7, on the other hand, the first to fifth admittances take the following formulae.

$Ys = sC1$ $Yx = (R1 + sC3)/(R1 \times sC3)$ $YP = sC2$ $YN = 1/R2$ $YL = sCL$

As described above, the band pass filters according to the first to third embodiments are formed by combining a high pass filter and a low pass filter, and the current consumption thereof is suppressed by reducing the unity gain frequency fu of the latter stage low pass filter 16 to between approximately two and three times the center frequency fcent. However, by providing a polarity inverting circuit, for example an inverting amplifier or a constitution in which a positive electrode output terminal and a negative electrode output terminal of an amplifier are inverted and connected to a pair of feedback capacitors, between the feedback capacitor of the low pass filter and an output of an amplifier such as an OTA, the Q value of the band pass filter can be increased. Accordingly, the gain at the center frequency can be increased even when the unity gain frequency fu of the low pass filter is reduced, and as a result, the bandwidth can be narrowed.

Further, by forming the OTA constituting the low pass filter from an active Gm RC OTA and forming a second order low pass filter from a single OTA having an RC circuit and the feedback capacitor C2 of the OTA, the number of OTAs is reduced, leading to a reduction in current consumption.

For example, by reducing the unity gain frequency of the low pass filter from approximately ten times a conventional center frequency fcent to approximately double, the current consumption can be reduced to 20%. Further, since a second order low pass filter is formed from a single OTA, the current consumption can be approximately halved in comparison with a case where two OTAs are required, as in "Tien-Yu Lo, Chuan-Cheng Hsiao, Kang-Wei Hsuch, and Hung-Sung Li, "A 1-V 60 MHz Bandpass Filter with Quality-Factor Calibration in 65 nm CMOS", Proc. Of IEEE Asia Solid-State Circuit Conference, pp. 53-56, 2009". In other words, the total current consumption can be reduced to 10%.

Furthermore, in the second embodiment, variation in the center frequency caused by parasitic capacitance in the input terminal of the amplifier can be suppressed by providing the variable capacitance capacitor C3 and adjusting the capacitance value thereof.

Further, in the third embodiment, gain variation at the center frequency of the band pass filter can be suppressed by supplying the common mode voltage of the differential signal to the input terminal of the amplifier via the second resistor R1 of the high pass filter.

Moreover, by making the band pass filter a low pass filter configuration, constructing a ring oscillator from the low pass filter, and adjusting the capacitance value of the variable capacitance capacitor C3 such that the oscillation frequency of the ring oscillator is identical to the desired center frequency, as in the fourth embodiment, the center frequency of the band pass filter can be set at the desired frequency. In so doing, an adjustment process is simplified.

The band pass filters of the first to third embodiments are second order filters, but these filters may be connected in a plurality of stages to form a high order band pass filter such as a fourth order, sixth order, or other order band pass filter.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A band pass filter, comprising:
   a high pass filter into which an input signal is input;
   an amplifier having an inverting input terminal into which an output of the high pass filter is input, wherein the amplifier amplifies an input voltage between the inverting input terminal and a non-inverting input terminal and outputs an output signal to an output terminal;
   a first resistor connected between a non-inverting output terminal and the inverting input terminal of the amplifier;
   a first capacitor having a first terminal that is connected to the inverting input terminal; and
   an inverting amplifier that inverts a polarity of an output signal from the non-inverting output terminal of the amplifier and outputs the inverted signal to a second terminal of the first capacitor.

2. The band pass filter according to claim 1, further comprising:
   a variable capacitance capacitor, provided between the inverting input terminal of the amplifier and a reference voltage, in that a capacitance value thereof can be varied, and
   a capacitance value variably setting unit configured to variably control the capacitance value of the variable capacitance capacitor to set the capacitance value such that a center frequency of the band pass filter reaches a desired frequency.

3. The band pass filter according to claim 2, wherein the high pass filter comprises a second capacitor having a first terminal into which the input signal is input and a second resistor provided between a second terminal of the second capacitor and a reference potential, the second terminal being connected to the inverting input terminal of the amplifier,
   the band pass filter further comprises first, second and third switches; and
   a third resistor having a second terminal being connected to the second terminal of the second capacitor, wherein
   the capacitance value variably setting unit configured to convert the band pass filter into a capacitance value calibrating low pass filter, by controlling the first switch to make the input signal, inputting to the first terminal of the second capacitor, input to a first terminal of the third resistor, by controlling the second switch to disconnect the second resistor from the inverting input terminal, and by controlling the third switch to make a feedback loop of the first capacitor open,
   form a ring oscillator by connecting the capacitance value calibrating low pass filters in series, and
   set the capacitance value of the variable capacitance capacitor such that an oscillation frequency of the ring oscillator matches the desired center frequency.

4. The band pass filter according to claim 1, wherein the high pass filter comprises a second capacitor having a first terminal into which the input signal is input and a second resistor provided between a second terminal of the second capacitor and a reference potential, the second terminal being connected to the inverting input terminal of the amplifier.

5. A band pass filter comprising:
   a high pass filter into which a differential input signal is input;
   an amplifier having a non-inverting input terminal and an inverting input terminal into which a differential output signal of the high pass filter is input, wherein the amplifier amplifies the differential input signal and outputs a differential output signal to an inverting output terminal and a non-inverting output terminal;
   a first positive side resistor connected between the inverting output terminal and the non-inverting input terminal of the amplifier;
   a first negative side resistor connected between the non-inverting output terminal and the inverting input terminal of the amplifier;
   a first positive side capacitor connected between the non-inverting output terminal and the non-inverting input terminal of the amplifier; and
   a first negative side capacitor connected between the inverting output terminal and the inverting input terminal of the amplifier.

6. The band pass filter according to claim 5, further comprising:
   a positive side variable capacitance capacitor, provided between the non-inverting input terminal of the amplifier and a reference voltage, in that a capacitance value thereof can be varied;
   a negative side variable capacitance capacitor, provided between the inverting input terminal of the amplifier and the reference voltage, in that a capacitance value thereof can be varied; and
   a capacitance value variably setting unit configured to variable control the capacitance values of the positive side and negative side variable capacitance capacitors to set the capacitance values such that a center frequency of the band pass filter reaches a desired frequency.

7. The band pass filter according to claim 6, wherein the high pass filter comprises second positive side and negative side capacitors having respective first terminals into which the differential input signal is input, and second positive side, and negative side resistors provided between respective second terminals of the second positive side and negative side capacitors and a reference potential, the second terminals of the second positive side and negative side capacitors being connected respectively to the non-inverting input terminal and the inverting input terminal of the amplifier,
   the band pass filter further comprises first, second and third switches; and
   third positive side and negative side resistors having second terminals being respectively connected to the second terminals of the second positive side and negative side capacitors, wherein the capacitance value variably setting unit configured to
convert the band pass filter into a capacitance value calibrating low pass filter, by controlling the first switches to make the input signal, inputting to the first terminals of the second positive side and negative side capacitors, input to first terminals of the third positive side and negative side resistors, by controlling the second switches to disconnect the second positive side and negative side resistors from the non-inverting and inverting input terminals, and by controlling the third switches to make feedback loops of the first positive side and negative side capacitors open, form a ring oscillator by connecting the capacitance value calibrating low pass filters in series, and set the capacitance values of the positive side and negative side variable capacitance capacitors such that an oscillation frequency of the ring oscillator matches the desired center frequency.

8. The band pass filter according to claim 5, wherein the high pass filter comprises second positive side and negative side capacitors respectively having first terminals into which the differential input signal is input, and second positive side and negative side resistors provided between respective second terminals of the second positive side and negative side capacitors and a reference potential, the second terminals of the second positive side and negative side capacitors being connected respectively to the non-inverting input terminal and the inverting input terminal of the amplifier.

9. The band pass filter according to claim 5, wherein the high pass filter comprises second positive side and negative side capacitors (C1) respectively having first terminals into which the differential input signal is input, and second positive side and negative side resistors (R1) provided between respective second terminals of the second positive side and negative side capacitors and a common mode voltage (VCM) of the differential input signal, the second terminals of the second positive side and negative side capacitors being connected respectively to the non-inverting input terminal and the inverting input terminal of the amplifier.

10. A calibration method for a band pass filter, comprising:
a high pass filter into which a differential input signal is input;
an amplifier having a non-inverting input terminal and an inverting input terminal into which a differential output signal of the high pass filter is input, wherein the amplifier amplifies the differential input signal and outputs a differential output signal to an inverting output terminal and a non-inverting output terminal;
a first positive side resistor connected between the inverting output terminal and the non-inverting input terminal of the amplifier;
a first negative side resistor connected between the non-inverting output terminal and the inverting input terminal of the amplifier;
a first positive side capacitor connected between the non-inverting output terminal and the non-inverting input terminal of the amplifier;
a first negative side capacitor connected between the inverting output terminal and the inverting input terminal of the amplifier;
a positive side variable capacitance capacitor that is provided between the non-inverting input terminal of the amplifier and a reference voltage such that a capacitance value thereof can be varied; and
a negative side variable capacitance capacitor that is provided between the inverting input terminal of the amplifier and the reference voltage such that a capacitance value thereof can be varied;
wherein the high pass filter comprises second positive side and negative side capacitors respectively having first terminals into which the differential input signal is input, and second positive side and negative side resistors provided between respective second terminals of the second positive side and negative side capacitors and a reference potential, the second terminals of the second positive side and negative side capacitors being connected respectively to the non-inverting input terminal and the inverting input terminal of the amplifier,
the band pass filter further having first, second and third switches; and
third positive side and negative side resistors having second terminals being respectively connected to the second terminals of the second positive side and negative side capacitors,
the calibration method comprising:
converting the band pass filter into a capacitance value calibrating low pass filter, by controlling the first switches to make the input signal, inputting to the first terminals of the second positive side and negative side capacitors, input to first terminals of the third positive side and negative side resistors, by controlling the second switches to disconnect the second positive side and negative side resistors from the non-inverting and inverting terminals, and by controlling the third switches to make feedback loops of the first positive side and negative side capacitors open,
form a ring oscillator by connecting the capacitance value calibrating low pass filters in series, and
set the respective capacitance values of the positive side and negative side variable capacitance capacitors such that an oscillation frequency of the constructed ring oscillator matches a desired center frequency.

* * * * *